(12) United States Patent
Harada et al.

(10) Patent No.: US 8,907,422 B2
(45) Date of Patent: Dec. 9, 2014

(54) SEMICONDUCTOR DEVICE

(71) Applicant: DENSO CORPORATION, Kariya (JP)

(72) Inventors: Syunsuke Harada, Kariya (JP); Takashi Nakano, Nukata-gun (JP); Takuya Okuno, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/951,644

(22) Filed: Jul. 26, 2013

(65) Prior Publication Data

US 2014/0131798 A1    May 15, 2014

(30) Foreign Application Priority Data

Nov. 14, 2012  (JP) ................................. 2012-250139

(51) Int. Cl.
*H01L 29/78*    (2006.01)
(52) U.S. Cl.
CPC ................................. *H01L 29/7816* (2013.01)
USPC ......................................................... 257/343
(58) Field of Classification Search
CPC ............ H01L 29/7835; H01L 29/0487; H01L 29/42368; H01L 29/66659; H01L 29/0696
USPC ......................................................... 257/343
See application file for complete search history.

(56) References Cited

U.S. PATENT DOCUMENTS

| 8,242,535 B2 * | 8/2012 | Senoo ........................... 257/139 |
| 2011/0233559 A1 | 9/2011 | Ishikura | |

FOREIGN PATENT DOCUMENTS

| JP | H05-291574 A | 11/1993 |
| JP | H11-345977 A | 12/1999 |
| JP | 2005-243832 A | 9/2005 |
| JP | 2005-332891 A | 12/2005 |
| JP | 2006-210865 A | 8/2006 |
| JP | 2009-130164 A | 6/2009 |

OTHER PUBLICATIONS

Office Action mailed Aug. 26, 2014 in the corresponding JP application No. 2012-250139 (with English translation).

* cited by examiner

*Primary Examiner* — Matthew W Such
*Assistant Examiner* — Monica D Harrison
(74) *Attorney, Agent, or Firm* — Posz Law Group, PLC

(57) ABSTRACT

A semiconductor device includes: a semiconductor substrate including a first semiconductor layer on the semiconductor substrate; multiple semiconductor elements in the semiconductor substrate; and an ineffective region. Each semiconductor element includes: a second semiconductor layer in a surface portion of the first semiconductor layer; a third semiconductor layer disposed in another surface portion of the first semiconductor layer and spaced a part from the second semiconductor layer; and a control layer disposed on a portion of the first semiconductor layer between the second semiconductor layer and the third semiconductor layer. The ineffective region is disposed in the semiconductor substrate between at least two adjacent semiconductor elements; and does not provide a function of the semiconductor elements.

4 Claims, 14 Drawing Sheets

FIG. 8
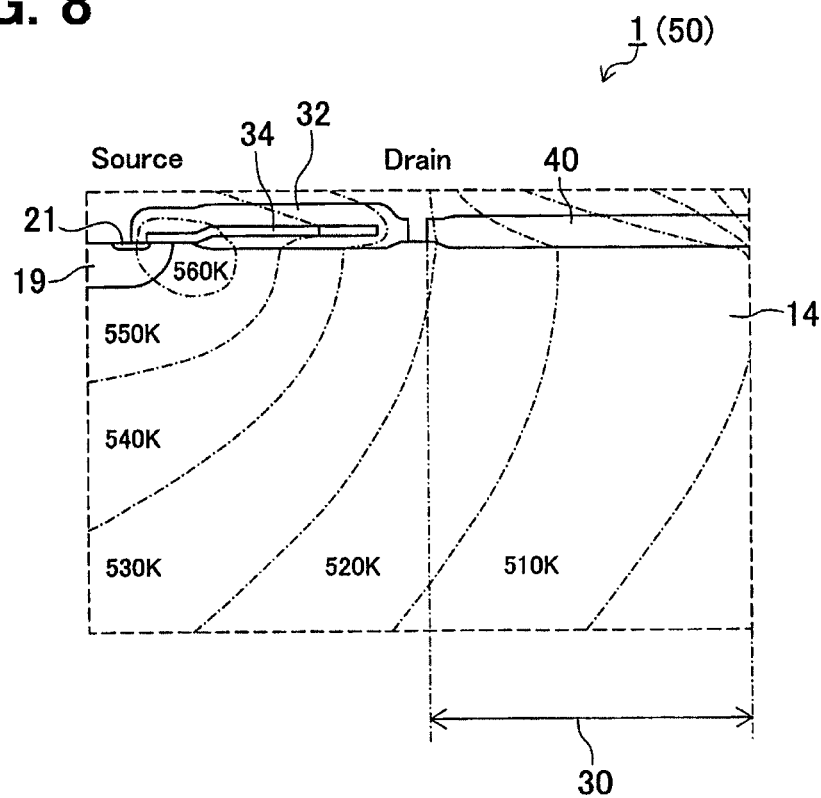
FIG. 9  COMPARISON
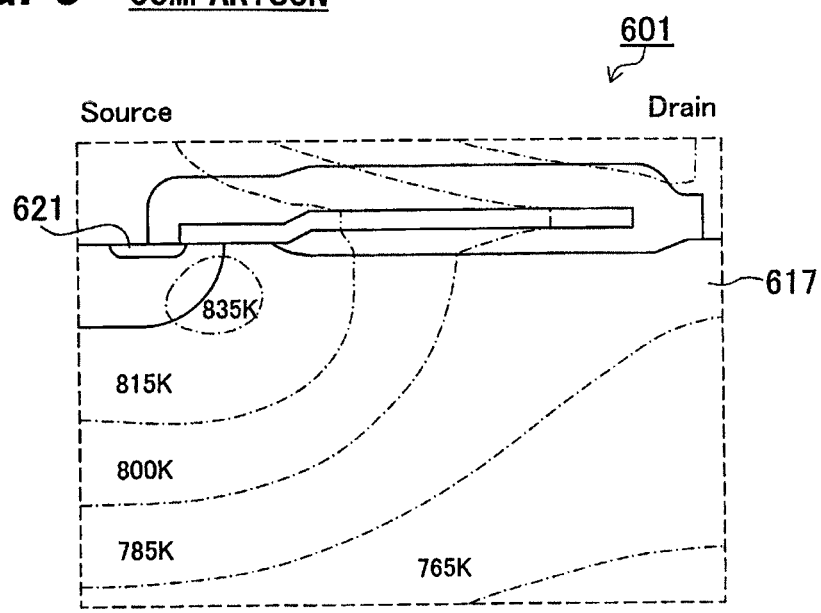

US 8,907,422 B2

SEMICONDUCTOR DEVICE

CROSS REFERENCE TO RELATED APPLICATION

This application is based on Japanese Patent Application No. 2012-250139 filed on Nov. 14, 2012, the disclosure of which is incorporated herein by reference.

TECHNICAL FIELD

The present disclosure relates to a semiconductor device.

BACKGROUND

Conventionally, a LDMOS (laterally diffused metal oxide semiconductor) transistor and a IGBT (insulated gate bipolar transistor) are well known as a power semiconductor device for large current. It is necessary for the semiconductor device to secure a withstand voltage (i.e., L load tolerance) with respect to a reverse electromotive force, which is applied in a case where a L load such as a coil is connected. Specifically, the semiconductor device generates heat when the device functions. Thus, a parasite bipolar operation may be easily induced, and the L load tolerance may be reduced easily. A technique for restricting the reduction of the L load tolerance in the semiconductor device is, for example, disclosed in JP-A-2005-243832.

JP-A-2005-243832 teaches a LDMOS transistor such that an impurity concentration near a drain cell (as a drift layer) through a base layer is set to be high impurity concentration so that the L load tolerance for practical use is secured. Further, in the LDMOS transistor, the width of the base layer is in a range between 1.0 micrometers and 1.4 micrometers.

In the LDMOS disclosed in JP-A-2005-243832, the L load tolerance is improved. However, since the impurity concentration near the drift layer through the base layer is increased, the on-state resistance is largely increased in contrast with the improvement of the withstand voltage. Further, it is necessary to design the width of the base layer within a certain range, which is comparatively limited. Thus, a design of the semiconductor device and the manufacturing method are restricted. Thus, another technique is required.

SUMMARY

It is an object of the present disclosure to provide a semiconductor device. An on-state resistance of the device is restricted from increasing, and the L load tolerance is improved.

According to an example aspect of the present disclosure, a semiconductor device includes: a semiconductor substrate including a first semiconductor layer, which has a first conductive type and is disposed on a principal surface of the semiconductor substrate; a plurality of semiconductor elements disposed on at least the principal surface of the semiconductor substrate; and an ineffective region. Each semiconductor element includes: a second semiconductor layer disposed in a surface portion of the first semiconductor layer; a third semiconductor layer disposed in another surface portion of the first semiconductor layer and spaced apart from the second semiconductor layer; and a control layer disposed on a portion of the first semiconductor layer between the second semiconductor layer and the third semiconductor layer. The ineffective region is disposed in the semiconductor substrate between at least adjacent two of the plurality of semiconductor elements. The ineffective region does not provide a function of the semiconductor elements.

In the above device, since the ineffective region is disposed between the semiconductor elements, heat generated in each semiconductor element is discharged from the ineffective region to the outside of the device when the semiconductor element functions. Thus, the increase of the on-state resistance of the device is restricted, and a L load tolerance is improved.

BRIEF DESCRIPTION OF THE DRAWINGS

The above and other objects, features and advantages of the present disclosure will become more apparent from the following detailed description made with reference to the accompanying drawings. In the drawings:

FIG. 8 is a diagram showing heat distribution when the semiconductor device performs a switching operation;

FIG. 9 is a diagram showing heat distribution when a comparison semiconductor device without the ineffective region performs a switching operation;

DETAILED DESCRIPTION

First Embodiment

Figure 1:
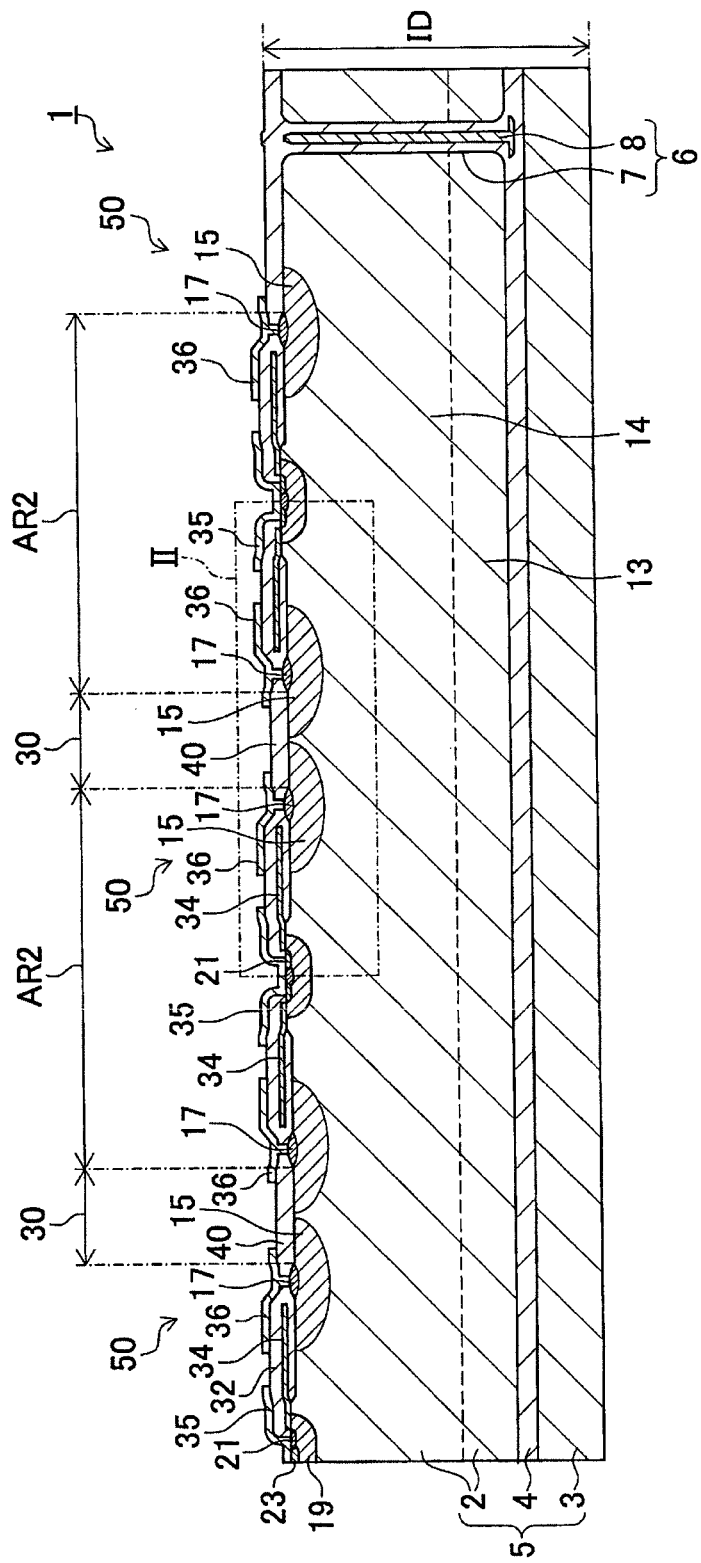
FIG. 1 is a diagram showing a cross sectional view of a semiconductor device according to a first embodiment.

As shown in FIG. 1, a semiconductor device 1 according to the present embodiment is a LDMOS transistor. The device 1 includes a SOI substrate 5, in which a SOI (silicon on insulator) layer 2 made of a N conductive type silicon and a P conductive type support substrate 3 are bonded each other via an embedded oxide film 4. The SOI substrate 5 is prepared such that a thickness of the SOI layer 2 is about 14 micrometers, and a thickness of the embedded oxide film 4 is about 1.2 micrometers. Here, the SOI layer 2 corresponds to a first semiconductor layer having a first conductive type, and the SOI substrate 5 corresponds to a semiconductor substrate.

The SOI layer 2 is arranged on a principal surface (an upper side of FIG. 1) of the SOI substrate 5 as a N conductive type silicon layer. The SOI layer 2 is formed by polishing a silicon layer bonded to the support substrate 3 so as to have a predetermined thickness, or by depositing silicon on the support substrate 3. The SOI layer 2 includes multiple trench separation portions 6 (i.e., multi-trenches), which isolate and separate from other elements. Each trench separation portion 6 includes a trench 7 and an embedded film 8. The trench 7 reaches the embedded oxide film 4 from the surface of the SOI layer 2. The embedded film 8 is embedded in the trench 7 so as to fill the trench 7. The embedded film 8 is made of, for example, an oxide film such as a $SiO_2$ film.

The SOI layer 2 has a N conductive type. The SOI layer 2 has a stacking structure of a N conductive type semiconductor layer 13 as an embedded layer and a N− conductive type semiconductor layer 14 as an epitaxial layer, which are stacked in this order. The layer 14 has an impurity concentration lower than the layer 13. The layer 13 includes antimony as a dopant, and has a carrier concentration of $6.3\times10^{18}$ cm$^{-3}$, and a thickness of 6.45 micrometers. The layer 14 has a carrier concentration of, for example, $2.0\times10^{15}$ cm$^{-3}$. Here, the N− conductive type semiconductor layer 14 corresponds to the first semiconductor layer having the first conductive type.

A N conductive type well layer 15, a N+ conductive type layer 17 as a drain layer, a P conductive type channel layer 19, a N+ conductive type layer 21 as a source layer, and a P+ conductive type layer 23 are formed in a surface portion of the SOI layer 2, i.e., in a surface portion of the N− conductive type semiconductor layer 14. The well layer 15 has an impurity concentration higher than the layer 14. The N+ conductive type layer 17 is formed in the well layer 15. The channel layer 19 is arranged to be spaced apart from the well layer 15 and the N+ conductive type layer 17. The N+ conductive type layer 21 is formed in the channel layer 19. The P+ conductive type layer 23 is formed in the channel layer 19 to be adjacent to the N+ conductive type layer 21. The well layer 15 includes phosphorus as a dopant, and has a carrier concentration of $1.8\times10^{17}$ cm$^{-3}$. The thickness of the well layer 15 is about 5.37 micrometers. The N+ conductive type layer 17 has an impurity concentration higher than the well layer 15. The N+ conductive type layer 17 includes arsenic as a dopant. The N+ conductive type layer 17 has a carrier concentration of $1.8\times10^{20}$ cm$^{-3}$, and a thickness of 0.19 micrometers. The P conductive type channel layer 19 includes a boron as a dopant, and has a carrier concentration of $2.5\times10^{17}$ cm$^{-3}$, and a thickness of 1.40 micrometers. The N+ conductive type layer 21 has almost the same concentration as the N+ conductive type layer 17. The N+ conductive type layer 21 includes arsenic as a dopant, and has a carrier concentration of $1.8\times10^{20}$ cm$^{-3}$, and a thickness of 0.19 micrometers. The P+ conductive type layer 23 includes a $BF_2$ as a dopant, and has a carrier concentration of $7.0\times10^{19}$ cm$^{-3}$, and a thickness of 0.45 micrometers. Here, the N+ conductive type layer 17 corresponds to a third semiconductor layer. The N+ conductive type layer 21 corresponds to the second semiconductor layer.

Figure 2:
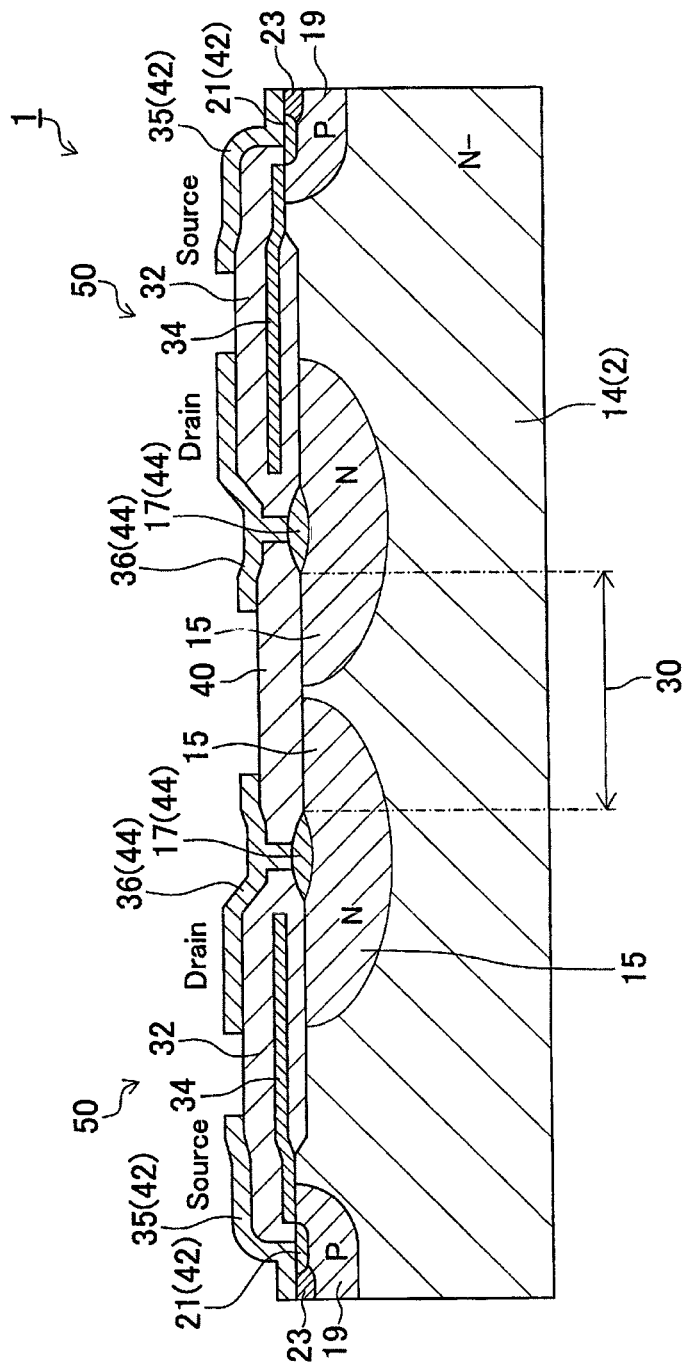
FIG. 2 is a diagram showing a partially enlarged cross sectional view of a part II of the device in FIG. 1.

An insulation film 40 is formed on the well layer 15 so as to bridge between adjacent drain layers 17. The insulation film 40 is made of, for example, a LOCOS (local oxidation of silicon) oxide film, a PSG (phosphor silicate glass) film, $SiO_2$, SiN, none-dopes silicon or the like. The insulation film 40 has a thickness of 1.0 micrometers, and a width of 8.0 micrometers. The insulation film 40 and the SOI layer 2 disposed under the insulation film 40 provide an ineffective region 30. As shown in FIGS. 1 and 2, the ineffective region 30 is arranged between the semiconductor elements 50. The ineffective region 30 does not function as the semiconductor element 50. Specifically, the ineffective region 30 blocks the carrier from flowing.

An interlayer insulation film 32 is formed on the SOI layer 2 between the N+ conductive type layer 17 and the N+ conductive type layer 21. The interlayer insulation film 32 contacts the N+ conductive type layer 17 and the N+ conductive type layer 21. A part of the interlayer insulation film 32 functions as a gate insulation film. The interlayer insulation film 32 is made of the LOCOS oxide film and the PSG film.

The first conductive layer 34 made of conductive material such as aluminum and poly silicon is formed in the interlayer insulation film 32. The first conductive layer 34 functions as a gate electrode. The first conductive type layer 34 corresponds to a control layer.

A second conductive layer 35 made of conductive material such as aluminum is formed at a position, which is disposed over the P conductive type channel layer 19, and covers a part of the interlayer insulation film 32. The second conductive layer 35 functions as a source electrode. Further, a third conductive layer 36 is formed at a position, which covers a part of the ineffective region 30 and a par of the interlayer insulation film 32. The third conductive layer 36 functions as a drain electrode.

Figure 3:
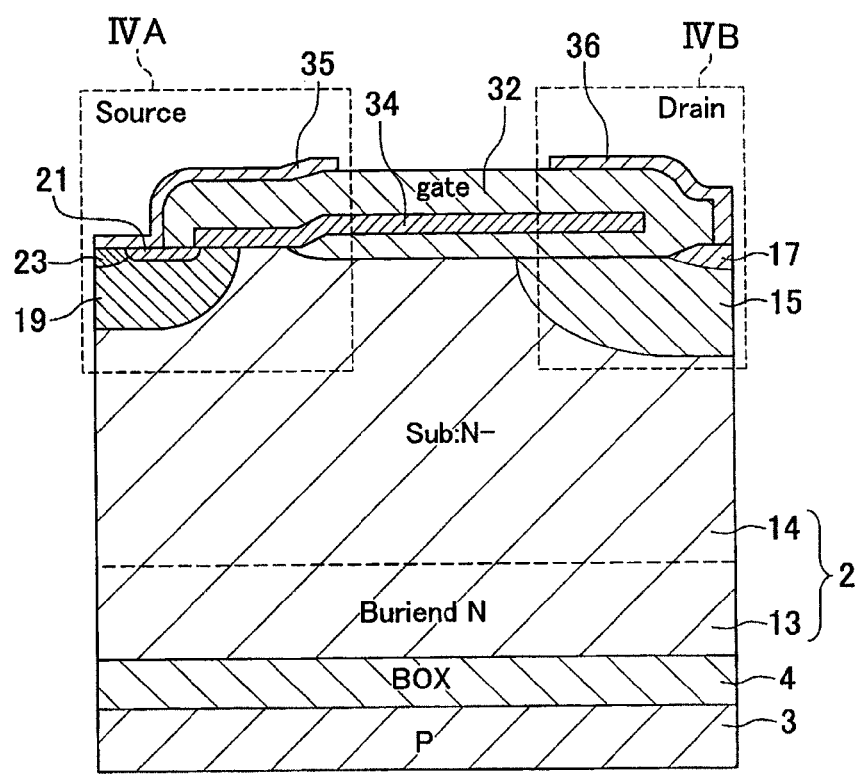
FIG. 3 is a diagram showing a unit cell of the device.
Figure 4A:
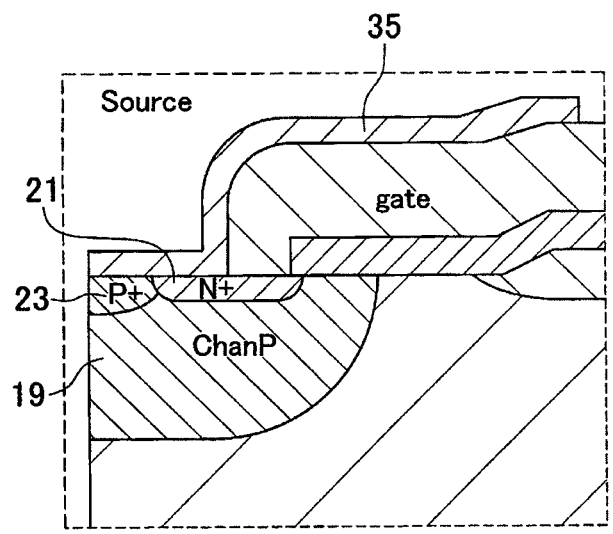
FIG. 4A is a diagram showing a partially enlarged cross sectional view of a part IVA of the unit cell in FIG. 3 corresponding to a source cell.
Figure 4B:
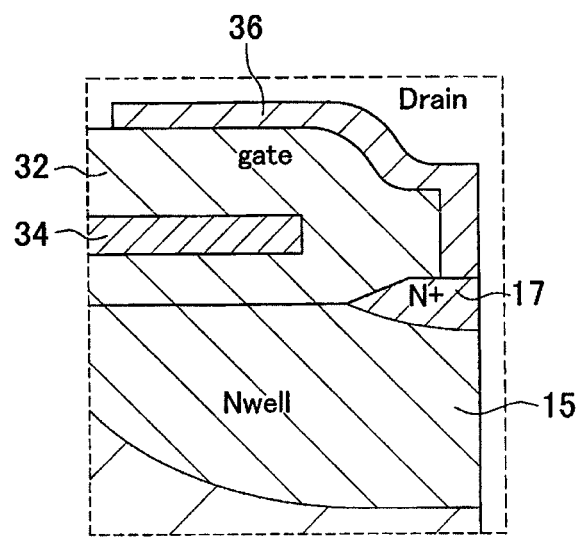
FIG. 4B is a diagram showing a partially enlarged cross sectional view of a part IVB of the unit cell in FIG. 3 corresponding to a drain cell.

As shown in FIGS. 3 and 4, the semiconductor element 50 includes a source cell 42, a drain cell 44, the interlayer insulation film 32 and the first conductive layer 34 as the gate electrode, which provide a unit cell. The source cell 42 includes a part of the channel layer 19 and the second conductive layer 35 as the source electrode. The drain cell 44 includes a part of the well layer 15 and the third conductive layer 36 as the drain electrode. The interlayer insulation film 32 and the first conductive layer 34 are disposed between the source cell 42 and the drain cell 44. A width of the unit cell defined as a cell pitch I, for example, 10.4 micrometers.

Figure 5:
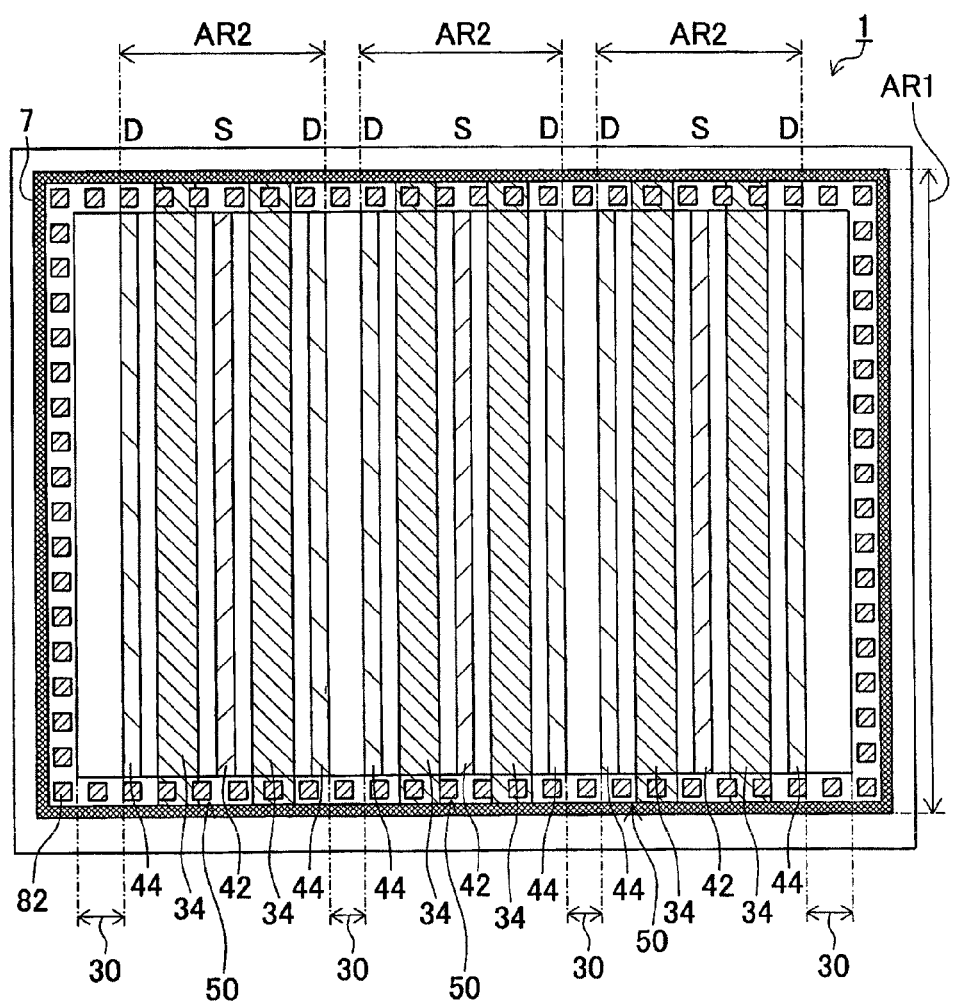
FIG. 5 is a diagram showing a plan view of the semiconductor device in FIG. 1 relating to an arrangement of the source cell, the drain cell and an ineffective region.

Further, in the present embodiment, as shown in FIG. 5, the source cell 42 and the drain cell 44 have a stripe plane structure, which extends along a predetermined direction as a longitudinal direction, when viewing the semiconductor device 1 from the principal surface. In an example in FIG. 5, the predetermined direction is an up-down direction of the drawing, which is in parallel to one side of the SOI substrate 5. The SOI substrate 5 provides a planar rectangular shape. The source cell 42 and the drain cell 44 extend along the predetermined direction as the longitudinal direction. Specifically, the region AR1 in FIG. 5 has the cross sectional structure shown in FIG. 1. In this structure, the N+ conductive type layer 17 as a third semiconductor layer and the N+ conductive type layer 21 as a second semiconductor layer extend along the longitudinal direction, which is perpendicular to a thickness direction of the SOI substrate 5. The thickness direction is shown as an arrow ID in FIG. 1. In multiple lines of the N+ conductive type layer 17 and the N+ conductive type layer 21, a part of regions in the SOI substrate 5 other than the N+ conductive type layer 17 and the N+ conductive type layer 21 is arranged along the predetermined direction as the longitudinal direction between two adjacent lines. At least a portion of the part of the regions in the SOI substrate 5 between lines of the N+ conductive type layer 17 and the N+ conductive type layer 21 provides the ineffective region 30.

In the semiconductor device 1, a predetermined area of the source cell 42 and the drain cell 44 provides an element region AR2, which functions as the semiconductor element 50. In the element region AR2, for example, the source cell 42 and the drain cell 44 are alternately arranged in parallel to each other. In the element region AR2 of the SOI substrate 5, the N+ conductive type layer 21 having a longitudinal shape and functioning as a part of the source cell 42 and the N+ conductive type layer 17 having a longitudinal shape and functioning as a part of the drain cell 44 are alternately arranged in parallel to each other. The well layer 15, the N− conductive type semiconductor layer 14, and the P conductive type channel layer 19 are disposed between the N+ conductive type layer 17 and the N+ conductive type layer 21, and each of the well layer 15, the N− conductive type semiconductor layer 14, and the P conductive type channel layer 19 has a longitudinal shape. Here, in the example shown in FIGS. 1 and 5, each of a pair of drain cells 44 is disposed on a side of the source cell 42, so that the pair of the drain cells 44 and the source cell 42 sandwiched between the drain cells 44 provide the element region AR2. A carrier flows through passage between the N+ conductive type layer 17 and the N+ conductive type layer 21.

A certain interlayer region between the N+ conductive type layer 17 and the N+ conductive type layer 21 provides the ineffective region 30. Specifically, the ineffective region 30 is provided between the element regions AR2 having a predetermined area. The ineffective region 30 does not function as the semiconductor element 50, so that current does not flow between adjacent two N+ conductive type layers 17. More specifically, as shown in FIG. 5, the drain cell 44 is arranged on each side of the source cell 42 so that the element region AR 2 is provided. Further, the ineffective region 30 is provided between the drain cell 44 disposed on an outside of the element region AR2 and the drain cell 44 disposed on an outside of the other element region AR2. As shown in FIG. 2, in the ineffective region 30, the N conductive type well layer 15 adjacent to the N+ conductive type layer 17 in one element region AR2 extends along a predetermined direction as a longitudinal direction (which is equal to an extending direction of the N+ conductive type layer 17). In the ineffective region 30, the N conductive type well layer 15 adjacent to the N+ conductive type layer 17 in the other element region AR2 extends along a predetermined direction as a longitudinal direction (which is equal to an extending direction of the N+ conductive type layer 17). Further, the N− conductive type semiconductor layer 14 disposed between two N conductive type well layers 15 extends along the predetermined direction as a longitudinal direction (which is equal to an extending direction of the N+ conductive type layer 17). No channel layer is formed in the ineffective region 30. Further, no control layer 34 is formed over the ineffective region 30. Accordingly, even if a voltage is applied to the control layer 34 of the element region AR2, the channel is not formed in the ineffective region 30, so that current does not flow. Thus, since the ineffective region 30 having a longitudinal shape is formed between multiple element regions AR2, heat generated in the element region AR2 is effectively radiated to the outside.

Further, in the present embodiment, the source cell 42 has a longitudinal shape, and the drain cell 44 having the longitudinal shape is disposed on each side of the source cell 42, so that the element region AR2 is formed. Multiple element regions AR2 are arranged to be space apart from each other, and the ineffective region 30 is arranged between the element regions AR2. Thus, the source cell 42 is arranged at a center of the element region AR2, and further, adjacent element regions AR2 are separated from each other via the ineffective region 30. Accordingly, although the source cell 42 may generate heat so that the temperature of the source cell 42 is easily increased, the distance between the source cells 42 is sufficiently secured. Thus, heat concentration in the SOI substrate 5 is much reduced. Specifically, since the temperature of the N+ conductive layer 21 is comparatively high when the LDMOS transistor is operated, the N+ conductive type layer 21 is disposed at a center of the element region AR2 in the SOI substrate 5. Since the temperature of the N+ conductive type layer 17 is low compared with the N+ conductive type layer 21, the N+ conductive type layer 17 is arranged on the outside of the element region AR2. Thus, the heat is not easily concentrated between the element regions AR2. Further, since the ineffective region 30 is formed between the element regions AR2, the heat radiation between the element regions AR2 is much enhanced. Therefore, the heat is limited to be accumulated around the N+ conductive type layer 21.

Figure 6A:
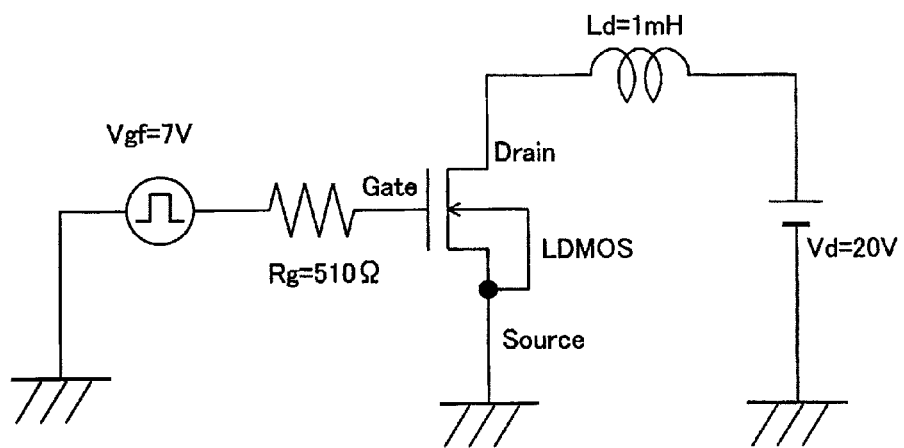
FIG. 6A is a diagram showing a load switching circuit, which is used for evaluating the L load tolerance and the on-state resistance.
Figure 6B:
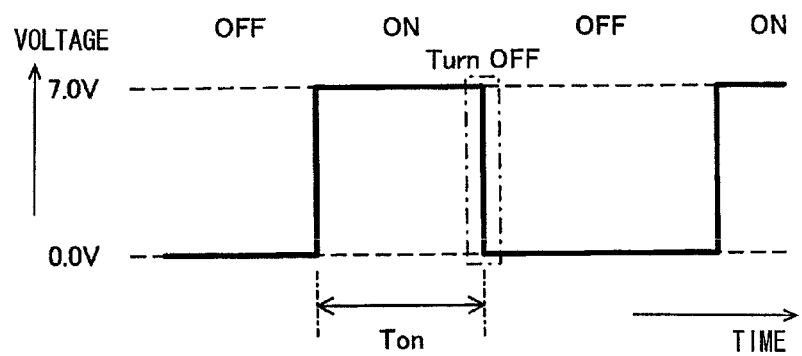
FIG. 6B is a graph showing a switching operation.
Figure 7:
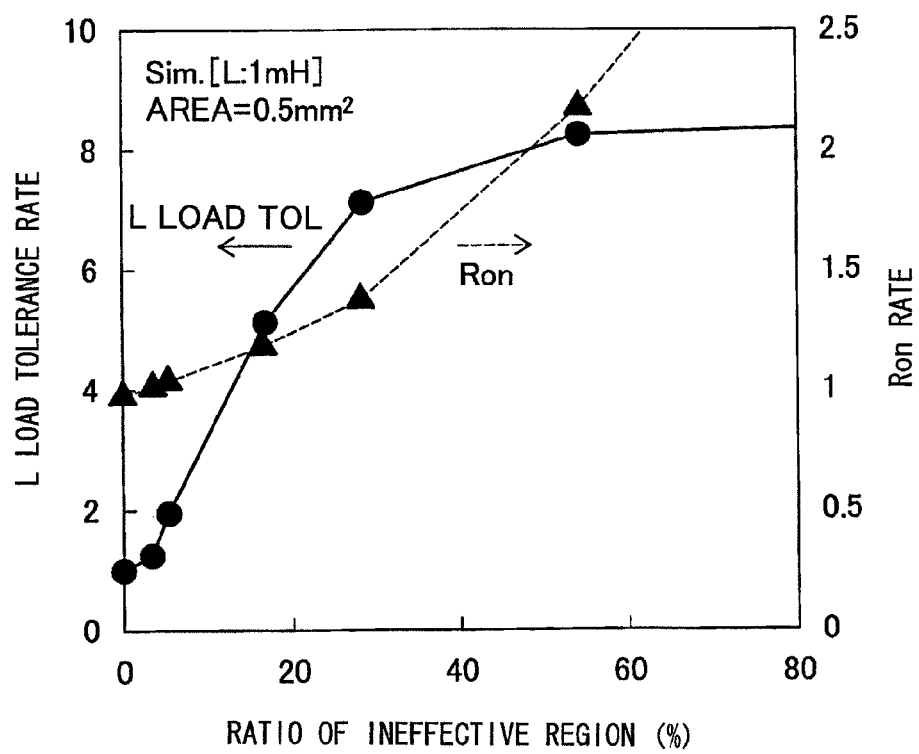
FIG. 7 is a graph showing a relationship among the L load tolerance rate and the on-state resistance rate when a ratio of the ineffective region with a cell area is varied.

Next, in the semiconductor device 1, with using a circuit shown in FIGS. 6A and 6B for simulating a L load surge, the L load tolerance and the on-state resistance are simulated, and the simulation result is shown in FIG. 7. Here, the cell area (which is an area in the trench 7) is 0.5 mm$^2$, and the value L is 1 nH, the value Vd is 20 volts, the value Vgf is 7 volts, and the value Rg is 510 Ohms in the circuit shown in FIG. 6A. When the switching operation of the circuit is performed, each value is evaluated in a case where the semiconductor device 1 turns off, as shown in FIG. 6B. In FIG. 7, the left vertical axis represents a L load tolerance rate corresponding to a solid line, and the right vertical axis represents the on-state resistance (i.e., Ron) rate corresponding to a broken line. Further, the horizontal axis represents a ratio of area between the ineffective region and the cell area. Here, the L load tolerance rate is a relative ratio when the L load tolerance is defined as "1" in a case where the ratio of area between the ineffective region and the cell area is zero. Further, the on-state resistance rate is a relative ratio when the on-state resistance is defined as "1" in a case where the ratio of area between the ineffective region and the cell area is zero.

As shown in FIG. 7, as the ratio of area between the ineffective region and the cell area becomes larger, the L load tolerance rate increases, so that the L load tolerance is improved. On the other hand, as the ratio of area between the ineffective region and the cell area becomes larger, the on-state resistance rate increases. However, the increasing ratio of the on-state resistance rate is limited, compared with the increasing ratio of the L load tolerance. For example, when the ratio of area between the ineffective region and the cell area is 55 percents, the on-state resistance becomes 2.3 times larger than a case where no ineffective region is formed (i.e., the ratio of area between the ineffective region and the cell area is zero). In this case, the L load tolerance becomes 8.3 times larger than a case where the ratio of area between the ineffective region and the cell area is zero.

Next, FIG. 8 shows heat distribution when the semiconductor device 1 having a cell pitch of 10.4 micrometers performs a switching operation. FIG. 9 shows heat distribution as a comparison when a semiconductor device 601 having a cell pitch of 10.4 micrometers without the ineffective region performs a switching operation. As shown in FIG. 8, in the semiconductor device 1 having the ineffective region according to the present embodiment, the temperature near the N+ conductive type layer 21 as a source layer, which generates the greatest heat, is about 560K. The temperature around the N+ conductive type layer 17 as a drain layer is reduced to be about 530K. On the other hand, as shown in FIG. 9, in the semiconductor device 601 without the ineffective region according to a comparison, the temperature near the N+ conductive type layer 621 as a source layer, which generates the greatest heat, is about 835K. Also, the temperature around the N+ conductive type layer 617 as a drain layer is reduced to be about 785K. According to the heat distribution data in FIGS.

8 and 9, when the ineffective region is formed in the device 1, the heat radiation effect is obtained sufficiently.

Next, a manufacturing method of the semiconductor device 1 will be explained with reference to FIGS. 10A to 12C.

Figure 10A:
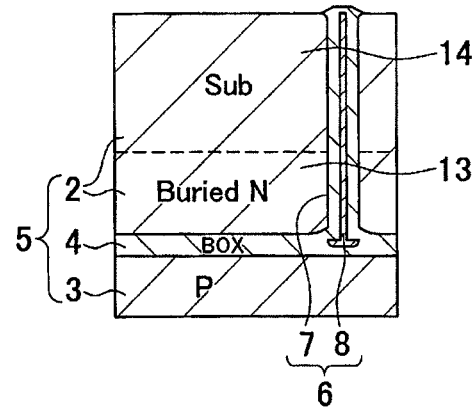
FIGS. 10A to 10C are diagrams showing a manufacturing method of the semiconductor device.
Figure 10B:
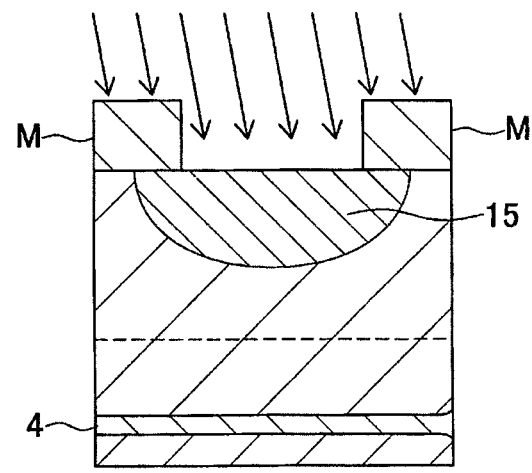
Figure 10C:
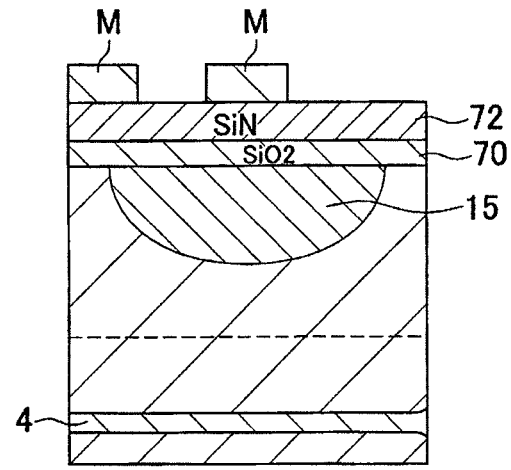
Figure 11A:
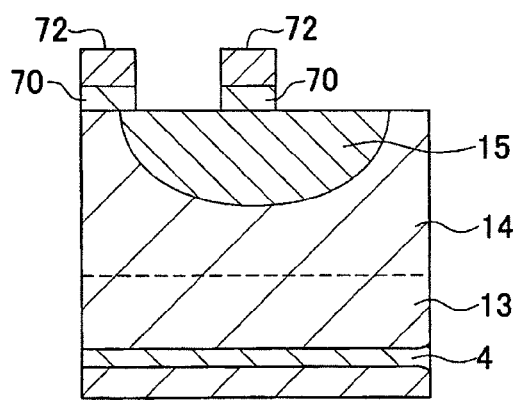
FIGS. 11A to 11C are diagrams showing a manufacturing method of the semiconductor device.

First, the SOI substrate 5 is prepared such that the SOI (silicon on insulator) layer 2 made of silicon is stacked on the support substrate 3 made of silicon via the embedded oxide film 4 made of a silicon oxide (i.e., $SiO_2$) film. Then, the trench 7 is formed, as shown in FIG. 10A. Next, a mask M is prepared by a photo lithography method or the like. Then, a phosphorous is ion-implanted with a dose amount of $5.0 \times 10^{13}/cm^2$, an acceleration voltage of 100 KeV, and a tilt angle of 7 degrees, as shown in FIG. 10B. The thermal treatment is performed so that the phosphorous is activated. Thus, the N conductive type well 15 is formed. Then, the surface is thermally oxidized, so that the $SiO_2$ film 70 is formed with a thickness of 425 Angstroms. The SiN film 72 is deposited on the $SiO_2$ film 70. The thickness of the SiN film 72 is 1650 Angstroms. The SiN film 72 is covered with a photo resist as a mask M, as shown in FIG. 10C. The $SiO_2$ film 70 and the SiN film 72 are etched, as shown in FIG. 11A.

Figure 11B:
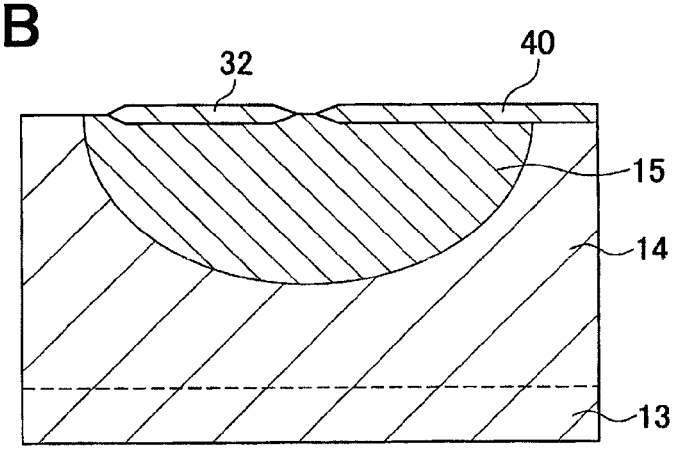
Figure 11C:
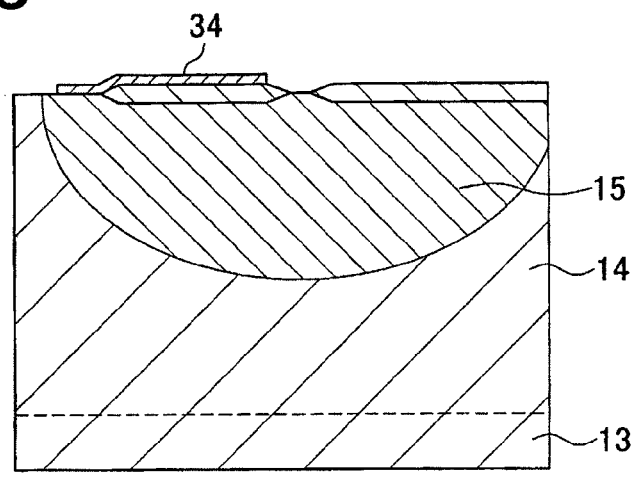
Figure 12A:
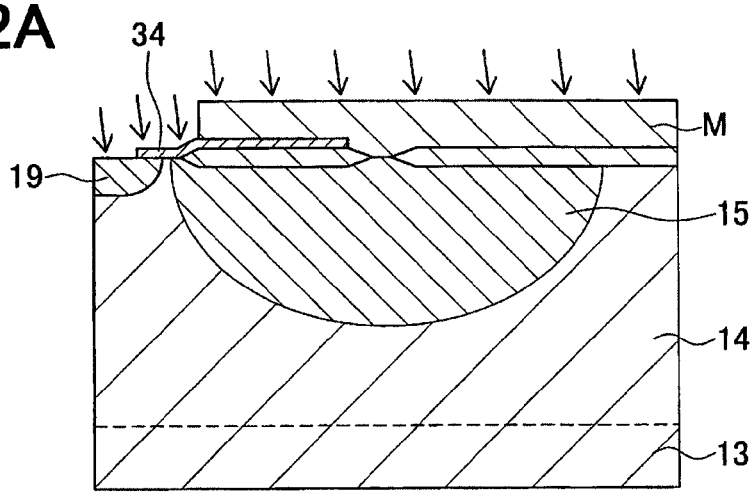
FIGS. 12A to 12C are diagrams showing a manufacturing method of the semiconductor device.
Figure 12B:
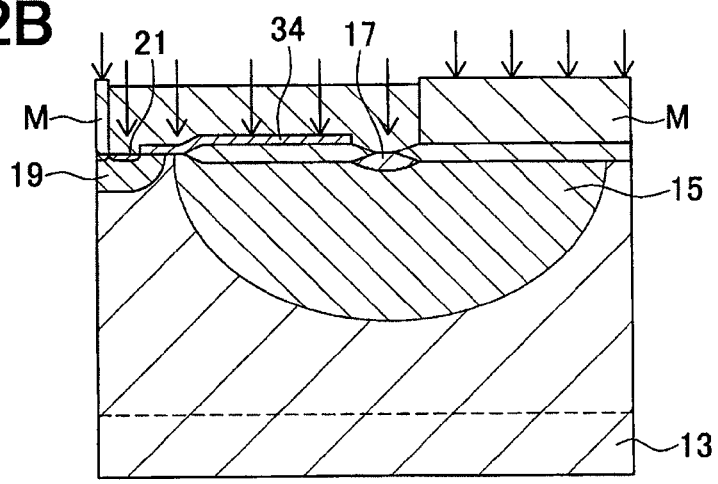
Figure 12C:
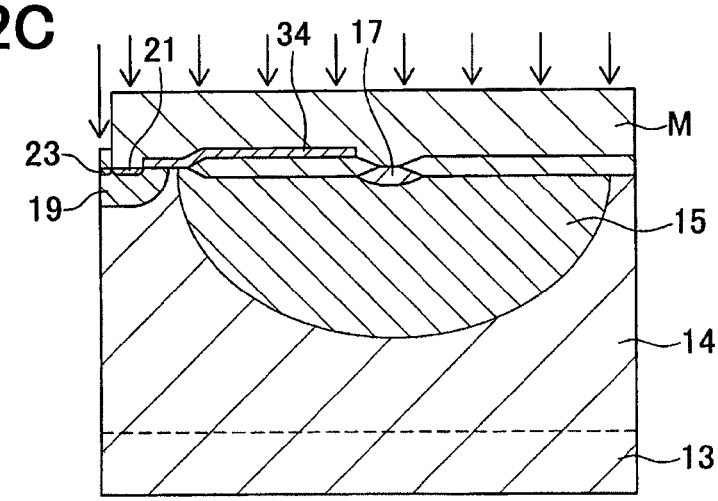

Next, a silicon surface is thermally oxidized, so that the insulation film 40 made of $SiO_2$ as a LOCOS film is formed with a thickness of 6900 Angstroms, as shown in FIG. 11B. Then, the SiN film 72 is removed, and then, a gate insulation film as the interlayer insulation film 32 is formed by a thermal oxidation method with a thickness of 250 Angstroms. Further, the poly-crystal silicon film functioning as a gate electrode is formed, as shown in FIG. 11C. Then, a mask is formed, and a boron is ion-implanted with a dose amount of $4.2 \times 10^{13}/cm^2$, an acceleration voltage of 30 KeV, and a tilt angle of 7 degrees. Then, the boron is activated by the thermal treatment. Thus, the P conductive type channel layer 19 is formed, as shown in FIG. 12A. Then, an arsenic is ion-implanted with a dose amount of $5.5 \times 10^{15}/cm^2$, an acceleration voltage of 120 KeV, and a tilt angle of 0 degree, as shown in FIG. 12B. Then, a $BF_2$ is ion-implanted with a dose amount of $3.0 \times 10^{15}/cm^2$, an acceleration voltage of 95 KeV, and a tilt angle of 0 degree, as shown in FIG. 12C. Then, the arsenic and the $BF_2$ are activated, so that the N+ conductive type layer 17, the N+ conductive type layer 21 and the P+ conductive type layer 23 are formed. Then, a PSG film is formed with a thickness of 6700 Angstroms, and then, the thermal treatment is performed. A contact is formed by an etching method, and the second conductive layer 35 and the third conductive layer 36 made of an aluminum film are formed, so that the semiconductor device 1 is manufactured, as shown in FIG. 13.

Figure 13:
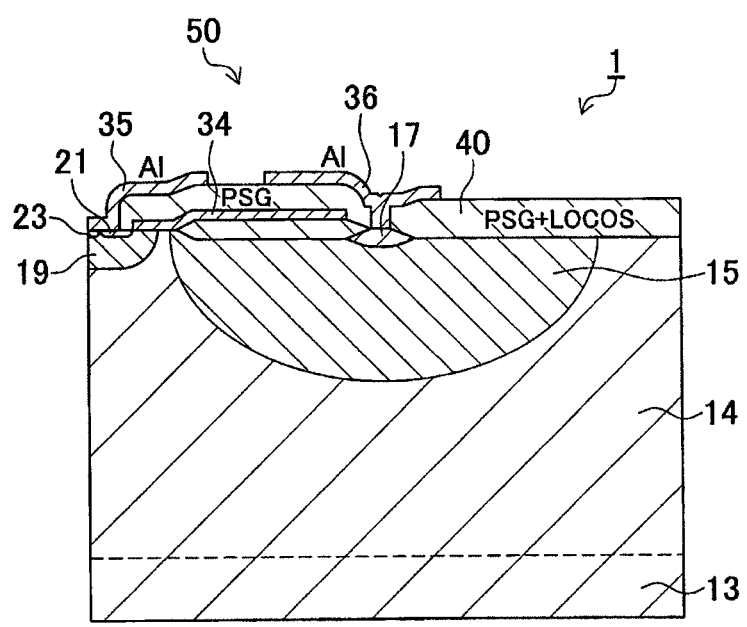
FIG. 13 is a diagram showing a manufacturing method of the semiconductor device.
Figure 14:
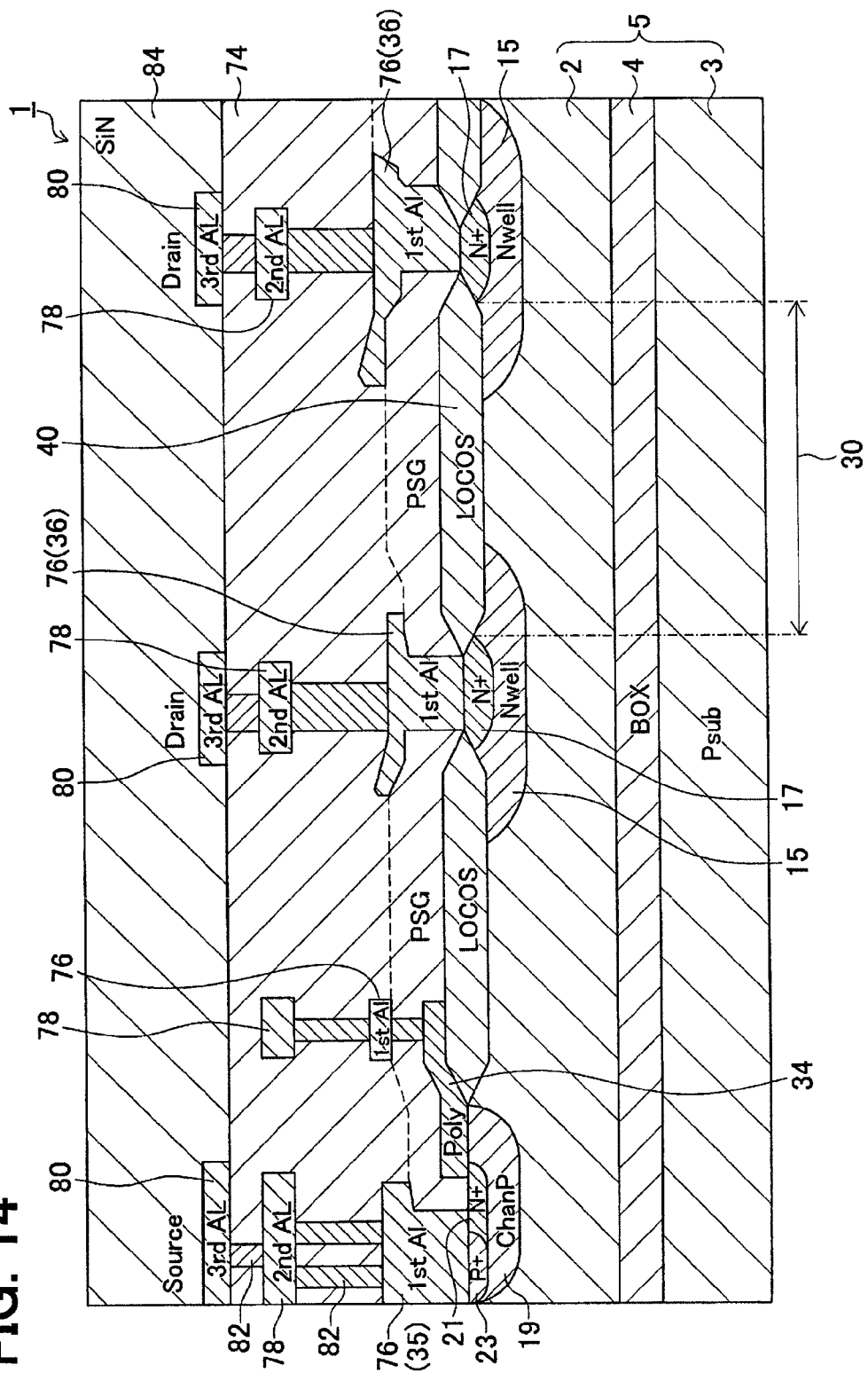
FIG. 14 is a diagram showing a cross sectional view of the semiconductor device.

Here, FIG. 14 shows a structure such that a multi-layered wiring is formed on the semiconductor device 1 shown in FIG. 13. As shown in FIG. 14, the insulation film 74 made of a PSG film and/or a TEOS film is formed to cover the surface of the SOI layer. The first wiring layer 76, the second wiring layer 78 and the third wiring layer 80 are formed on the SOI layer 2 via the insulation film 74 in this order from the SOI layer side. In the insulation film 74, a via-hole 82 is formed. Each wiring layer is electrically connected to each other through the via-hole 82. The first wiring layer 76 provides the second conductive layer 35 and the third conductive layer 36. Further, the first wiring layer 76 is connected to the poly crystal silicon film as the first conductive layer 34. Further, a passivation film 84 made of a SiN film or the like is formed over a surface of the device 1 so as to cover the surface. Thus, even when the multi-layered wiring is further formed on the device 1, the heat generated in the semiconductor device 1 is effectively radiated since the device 1 includes the ineffective region 30.

Thus, the semiconductor device 1 according to the first embodiment includes the SOI substrate 5 having the SOI layer 2 on the principal surface. Multiple semiconductor elements 50 as a LDMOS are formed on the principal surface side of the SOI substrate 5. The semiconductor element 50 includes the N+ conductive type layer 21 as a source layer formed on the SOI layer 2 on the principal surface side, the N+ conductive type layer 17 as a drain layer disposed over the SOI layer 2 on the principal surface side and spaced apart from the N+ conductive type layer 21, and the first conductive layer 34 as a control layer arranged over a portion between the N+ conductive type layer 21 and the N+ conductive type layer 17. In the SOI layer 2, the ineffective region 30, which does not function as the semiconductor element 50, is disposed between the semiconductor elements 50. Thus, since the ineffective region 30 is formed between the semiconductor elements 50, heat generated in the device 1 is effectively discharged from the ineffective region 30 to the outside of the device 1. Thus, the increase of the on-state resistance is limited, and the L load tolerance is improved.

Further, the N+ conductive type layer 21 as the source layer and the N+ conductive type layer 17 as the drain layer are formed to have a longitudinal shape, which is perpendicular to the thickness direction of the SOI substrate 5. Among multiple lines including the N+ conductive type layer 21 and the N+ conductive type layer 17, a part of the SOI substrate 5 other than the N+ conductive type layer 21 and the N+ conductive type layer 17 is disposed between two adjacent lines along a predetermined direction. The part of the SOI substrate 5 has a longitudinal shape. At least one of the parts of the SOI substrate 5 between the lines provides the ineffective region 30. In this case, the ineffective region 30 is arranged into a limited space efficiently, and the heat is effectively discharged to the outside, compared with a case where the source layer and the drain layer are simply arranged alternately.

Next, a semiconductor device 201 according to a modification of the first embodiment will be explained as follows. In the first embodiment, the semiconductor device 1 includes the LDMOS transistor. In the modification, the semiconductor device 201 includes an IGBT.

Figure 15:
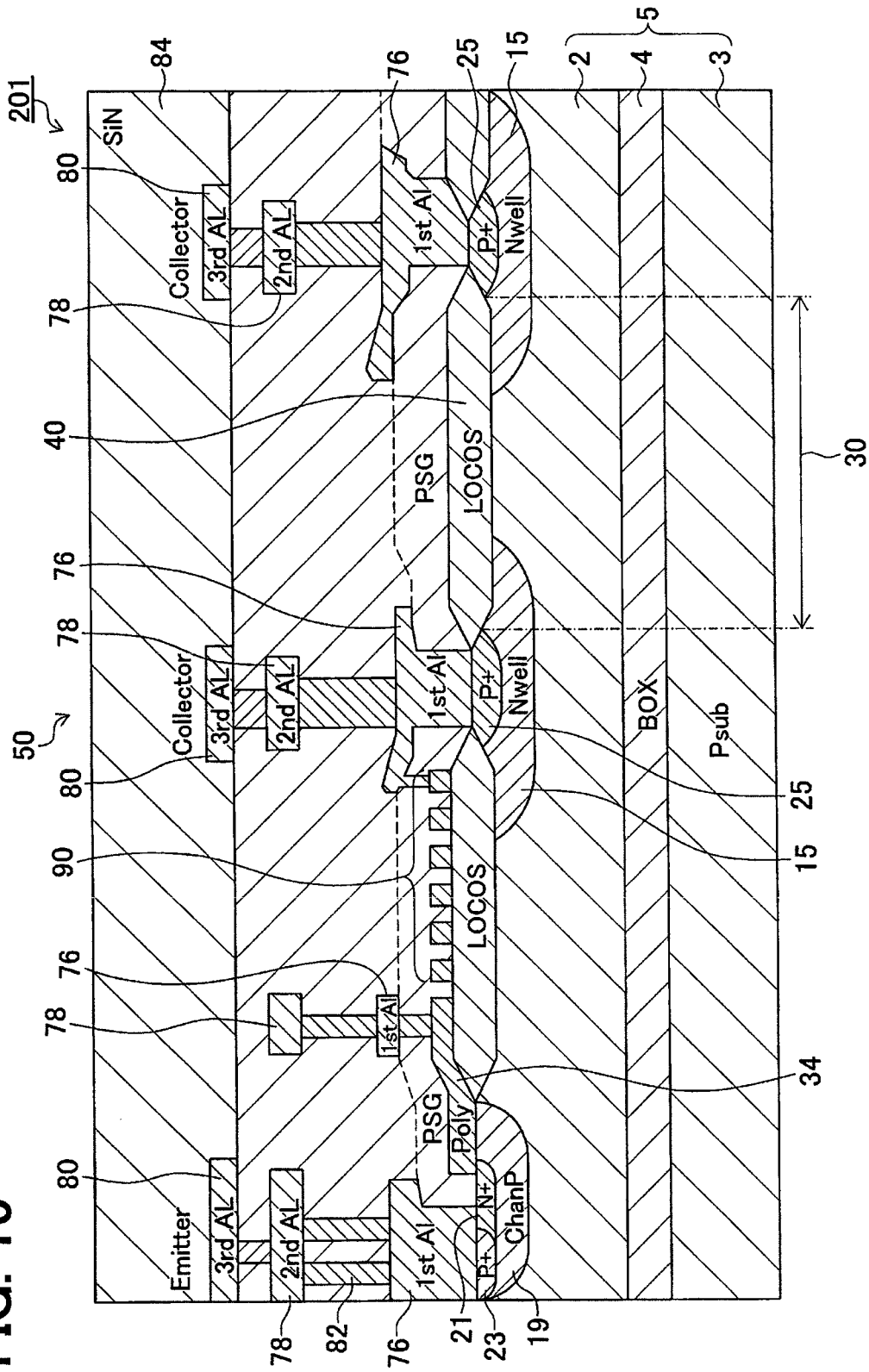
FIG. 15 is a diagram showing a cross sectional view of a semiconductor device according to a modification of the first embodiment.

As shown in FIG. 15, the semiconductor device 201 includes the SOI substrate 5, which is prepared by bonding the SOT layer 2 made of N conductive type silicon and the support substrate 3 having the P conductive type via the embedded oxide film 4. In the SOI substrate 5, the thickness of the SOT layer 2 is about 15 micrometers, and the thickness of the embedded oxide film 4 is about 6.0 micrometers. The SOI layer 2 has the N conductive type. For example, the carrier concentration of the SOI layer 2 is about $2.0 \times 10^{15}$ $cm^{-3}$. The N conductive type well layer 15 having the concentration higher than the SOI layer 2; the P+ conductive type layer 25 as a P conductive type collector layer in the N conductive type well layer 15, the P conductive type channel layer 19, the N+ conductive type layer 21 as a N conductive type emitter layer, and the P+ conductive type layer 23 are formed in a surface portion of the SOI layer 2. The N conductive type well layer 15 includes a phosphorous as a dopant, the carrier concentration of $1.8 \times 10^{17}$ $cm^{-3}$, and a thickness of 5.37 micrometers. The N+ conductive type layer 21 includes an arsenic as a dopant, a carrier concentration of $1.8 \times 10^{20}$ $cm^3$, and a thickness of 0.19 micrometers. The P conductive type channel layer 19 includes a born as a dopant, a carrier concentration of $1.7 \times 10^{17}$ $cm^3$, and a thickness of 1.50 micrometers. The P+ conductive type layer 23 includes BF2 as a dopant, a carrier concentration of $7.0 \times 10^{19}$ $cm^3$, and a thickness of 0.45 micrometers. The P+ conductive type layer 25 includes BF2 as a dopant, a carrier concentration of 7.0×

$10^{19}$ cm$^3$, and a thickness of 0.45 micrometers. A pitch (i.e., a distance between two centers of layers) between the P+ conductive type layer 23 and the P+ conductive type layer 25 is about 62.0 micrometers.

The interlayer insulation film 32 is formed to be adjacent to a region between the P+ conductive type layer 25 and the N+ conductive type layer 21. A part of the interlayer insulation film 32 functions as a gate insulation film. The interlayer insulation film 32 includes a LOCOS oxide film and a PSG film, for example. Further, the first conductive layer 34 made of poly crystal silicon is formed in the interlayer insulation film 32. The first conductive layer 34 functions as a gate electrode. Further, in the interlayer insulation film 32, a field plate 90 made of the same material as the first conductive layer 34 is formed. Thus, since the field plate 90 is formed in the interlayer insulation film 32, the depletion layer is expanded uniformly from the P+ conductive type layer 25 as a collector layer to the N+ conductive type layer 21 as an emitter layer, so that the electric potential distribution is homogenized. Accordingly, it is difficult to generate the concentration of the electric field.

Further, in the present modification, in the semiconductor elements 50, the P+ conductive type layers 25 as the collector are adjacent to each other. An insulation film 40 made of, for example, a LOCOS film is formed in a region between the P+ conductive type layers 25. The insulation film 40 has a thickness of 1.0 micrometer. The ineffective region 30 is provided by the insulation film 40 and the SOI layer 2 disposed under the insulation film 40, so that the P+ conductive type layers 25 are arranged to be adjacent to each other through the ineffective region 30. A distance as a pitch between the adjacent P+ conductive type layers 25 is about 16.0 micrometers.

Thus, even when the semiconductor device 201 includes the IGBT, since the ineffective region is formed in the device 201, the heat generated in the semiconductor device 201 is effectively radiated to the outside of the device 201. Thus, the L load tolerance is improved.

Other Embodiments

In the above embodiments, the semiconductor substrate is the SOI substrate 5 having a SOI structure. Alternatively, the semiconductor substrate may be made of a silicon substrate.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor device comprising:
a semiconductor substrate including a first semiconductor layer, which has a first conductive type and is disposed on a principal surface of the semiconductor substrate;
a plurality of semiconductor elements disposed on at least the principal surface of the semiconductor substrate; and
an ineffective region, wherein:
each semiconductor element includes:
  a second semiconductor layer disposed in a surface portion of the first semiconductor layer;
  a third semiconductor layer disposed in another surface portion of the first semiconductor layer and spaced apart from the second semiconductor layer; and
  a control layer disposed on a portion of the first semiconductor layer between the second semiconductor layer and the third semiconductor layer;
the ineffective region is disposed in the semiconductor substrate between at least adjacent two of the plurality of semiconductor elements;
the ineffective region does not provide a function of the semiconductor;
in each semiconductor element, the second semiconductor layer extends along a predetermined direction, which is perpendicular to a thickness direction of the semiconductor substrate;
in each semiconductor element, the third semiconductor layer extends along the predetermined direction, which is perpendicular to the thickness direction of the semiconductor substrate;
the ineffective region is disposed in a part of the semiconductor substrate, which extends along the predetermined direction; and
the part of the semiconductor substrate is disposed between one of the second and third semiconductor layers in one of the at least adjacent two of the plurality of semiconductor elements and one of the second and third semiconductor layers in the other of the at least adjacent two of the plurality of semiconductor elements.

2. The semiconductor device according to claim 1, wherein:
the ineffective region includes an insulation film and a part of the first semiconductor layer;
the part of the first semiconductor layer is disposed under the insulation film; and
the ineffective region blocks a flow of a carrier therein.

3. A semiconductor device comprising:
a semiconductor substrate including a first semiconductor layer, which has a first conductive type and is disposed on a principal surface of the semiconductor substrate;
a plurality of semiconductor elements disposed on at least the principal surface of the semiconductor substrate; and
an ineffective region, wherein:
each semiconductor element includes:
  a second semiconductor layer disposed in a surface portion of the first semiconductor layer;
  a third semiconductor layer disposed in another surface portion of the first semiconductor layer and spaced apart from the second semiconductor layer; and
  a control layer disposed on a portion of the first semiconductor layer between the second semiconductor layer and the third semiconductor layer;
the ineffective region is disposed in the semiconductor substrate between at least adjacent two of the plurality of semiconductor elements;
the ineffective region does not provide a function of the semiconductor elements;
the second semiconductor layer provides a source;
the third semiconductor layer provides a drain; and
the control layer provides a gate.

4. A semiconductor device comprising:
a semiconductor substrate including a first semiconductor layer, which has a first conductive type and is disposed on a principal surface of the semiconductor substrate;
a plurality of semiconductor elements disposed on at least the principal surface of the semiconductor substrate; and
an ineffective region, wherein:
each semiconductor element includes:
  a second semiconductor layer disposed in a surface portion of the first semiconductor layer;

a third semiconductor layer disposed in another surface portion of the first semiconductor layer and spaced apart from the second semiconductor layer; and a control layer disposed on a portion of the first semiconductor layer between the second semiconductor layer and the third semiconductor layer;

wherein the ineffective region is disposed in the semiconductor substrate between at least two adjacent semiconductor elements of the plurality of semiconductor elements;

wherein the ineffective region does not provide a function of the semiconductor elements, wherein the second semiconductor layer provides an emitter, wherein the third semiconductor layer provides a collector, and wherein the control layer provides a gate.

* * * * *